(12) United States Patent
Kim

(10) Patent No.: US 11,728,065 B2
(45) Date of Patent: Aug. 15, 2023

(54) MOLDED INTERCONNECT DEVICE

(71) Applicant: Ticona LLC, Florence, KY (US)

(72) Inventor: Young Shin Kim, Cincinnati, OH (US)

(73) Assignee: Ticona LLC, Florence, KY (US)

( * ) Notice: Subject to any disclaimer, the term of this patent is extended or adjusted under 35 U.S.C. 154(b) by 63 days.

(21) Appl. No.: 17/374,299

(22) Filed: Jul. 13, 2021

(65) Prior Publication Data
US 2022/0037050 A1 Feb. 3, 2022

Related U.S. Application Data

(63) Continuation of application No. 17/184,948, filed on Feb. 25, 2021, and a continuation of application No.
(Continued)

(51) Int. Cl.
H01B 1/12 (2006.01)
H05K 1/09 (2006.01)
(Continued)

(52) U.S. Cl.
CPC .............. H01B 1/124 (2013.01); H05K 1/09 (2013.01); H05K 3/101 (2013.01); H05K 9/0083 (2013.01);
(Continued)

(58) Field of Classification Search
CPC .......... H01B 1/124; H05K 1/09; H05K 1/181; H05K 2201/0329; H05K 2201/09118; H05K 2201/0141; H05K 9/0083
See application file for complete search history.

(56) References Cited

U.S. PATENT DOCUMENTS 4,458,039 A 7/1984 Eickman
4,943,606 A 7/1990 Inoue et al.
(Continued)

FOREIGN PATENT DOCUMENTS

EP 0 312 331 A2 4/1989
EP 0 312 331 A3 4/1989
(Continued)

OTHER PUBLICATIONS

Article—Liu et al., "Immobilization and melting point depression of imidazolium ionic liquids on the surface of nano-$SiO_x$ particles," *Dalton Trans.*, vol. 39, 2010, pp. 3190-3194.
(Continued)

*Primary Examiner* — Timothy J Thompson
*Assistant Examiner* — John B Freal
(74) *Attorney, Agent, or Firm* — Dority & Manning, P.A.

(57) ABSTRACT

A molded interconnect device that comprises a substrate and conductive elements disposed on the substrate is provided. The substrate comprising a polymer composition containing a polymer matrix that includes a thermotropic liquid crystalline polymer and from about 10 parts to about 80 parts by weight of a mineral filler per 100 parts by weight of the polymer matrix. The mineral filler has an average diameter of about 25 micrometers or less. The polymer composition contains copper in an amount of about 1,000 parts per million or less and chromium in an amount of about 2,000 parts per million or less, and further exhibits a surface resistivity of about $1\times10^{14}$ ohm or more.

24 Claims, 6 Drawing Sheets

Related U.S. Application Data

17/178,292, filed on Feb. 18, 2021, and a continuation of application No. 17/178,312, filed on Feb. 18, 2021, and a continuation of application No. 17/178,295, filed on Feb. 18, 2021.

(60) Provisional application No. 63/057,349, filed on Jul. 28, 2020, provisional application No. 63/057,353, filed on Jul. 28, 2020, provisional application No. 63/057,345, filed on Jul. 28, 2020.

(51) Int. Cl.
*H05K 9/00* (2006.01)
*H05K 3/10* (2006.01)

(52) U.S. Cl.
CPC ............ *H05K 2201/0141* (2013.01); *H05K 2201/0329* (2013.01)

(56) References Cited

U.S. PATENT DOCUMENTS

| | | | |
|---|---|---|---|
| 5,352,746 A | 10/1994 | Asai et al. | |
| 5,375,403 A | 12/1994 | Capote et al. | |
| 5,492,946 A | 2/1996 | Huspeni et al. | |
| 5,508,374 A | 4/1996 | Lee et al. | |
| 5,538,666 A | 7/1996 | Jin | |
| 5,830,940 A | 11/1998 | Nakamura et al. | |
| 5,847,039 A | 12/1998 | Nagashima et al. | |
| 5,928,589 A | 7/1999 | Norota et al. | |
| 5,962,122 A | 10/1999 | Walpita et al. | |
| 5,997,765 A | 12/1999 | Furuta et al. | |
| 6,010,760 A | 1/2000 | Miyazaki et al. | |
| 6,046,300 A | 4/2000 | Umetsu et al. | |
| 6,063,848 A | 5/2000 | Murakami et al. | |
| 6,140,455 A | 10/2000 | Nagashima et al. | |
| 6,153,121 A | 11/2000 | Makabe et al. | |
| 6,379,795 B1 | 4/2002 | Bisaria et al. | |
| 6,492,463 B1 | 12/2002 | Waggoner | |
| 6,495,616 B2 | 12/2002 | Maeda | |
| 6,613,847 B2 | 9/2003 | Soelch | |
| 6,641,928 B2 | 11/2003 | Takeichi et al. | |
| 6,680,002 B2 | 1/2004 | Yamauchi et al. | |
| 6,702,955 B1 | 3/2004 | Murakami et al. | |
| 6,702,956 B2 | 3/2004 | Maeda et al. | |
| 6,733,691 B2 | 5/2004 | Nagano et al. | |
| 6,755,992 B2 | 6/2004 | Okamoto et al. | |
| 6,758,989 B2 | 7/2004 | Miyashita et al. | |
| 6,797,198 B1 | 9/2004 | Miyashita et al. | |
| 6,818,821 B2 | 11/2004 | Fujieda et al. | |
| 6,833,405 B1 | 12/2004 | Cottis | |
| 6,861,463 B2 | 3/2005 | Cottis | |
| 7,079,405 B2 | 7/2006 | Tobita et al. | |
| 7,166,238 B2 | 1/2007 | Kato et al. | |
| 7,175,779 B1 | 2/2007 | Kricheldorf et al. | |
| 7,189,778 B2 | 3/2007 | Tobita et al. | |
| 7,239,261 B2 | 7/2007 | Fujieda et al. | |
| 7,251,405 B2 | 7/2007 | Shelnut et al. | |
| 7,276,284 B2 | 10/2007 | Frohs | |
| 7,344,657 B2 | 3/2008 | Okamoto et al. | |
| 7,438,832 B2 | 10/2008 | Majumdar et al. | |
| 7,540,991 B2 | 6/2009 | Shimoyama et al. | |
| 7,547,403 B2 | 6/2009 | Miyashita et al. | |
| 7,601,771 B2 | 10/2009 | Schmidt et al. | |
| 7,641,833 B2 | 1/2010 | Aoki et al. | |
| 7,648,748 B2 | 1/2010 | Nakane et al. | |
| 7,704,408 B2 | 4/2010 | Fukatsu | |
| 7,740,770 B2 | 6/2010 | Mizumoto et al. | |
| 7,789,670 B2 | 9/2010 | Fukatsu et al. | |
| 7,824,572 B2 | 11/2010 | Okamoto | |
| 7,825,176 B2 | 11/2010 | Kim et al. | |
| 7,892,450 B2 | 2/2011 | Uchida et al. | |
| 7,931,824 B2 | 4/2011 | Gin et al. | |
| 7,980,897 B2 | 7/2011 | Fukatsu et al. | |
| 7,985,351 B2 | 7/2011 | Yamauchi et al. | |
| 8,029,694 B2 | 10/2011 | Saga | |
| 8,066,907 B2 | 11/2011 | Kohinata et al. | |
| 8,142,683 B2 | 3/2012 | Murouchi et al. | |
| 8,192,645 B2 | 6/2012 | Murouchi et al. | |
| 8,202,448 B2 | 6/2012 | Fukuhara et al. | |
| 8,231,805 B2 | 7/2012 | Fukuhara et al. | |
| 8,272,879 B2 | 9/2012 | Fukatsu et al. | |
| 8,324,307 B2 | 12/2012 | Harder et al. | |
| 8,337,719 B2 | 12/2012 | Hosoda et al. | |
| 8,432,484 B2 | 4/2013 | Christison | |
| 8,440,780 B2 | 5/2013 | Hamaguchi et al. | |
| 8,465,670 B2 | 6/2013 | Kondo et al. | |
| 8,545,719 B2 | 10/2013 | Komatsu et al. | |
| 8,646,994 B2 | 2/2014 | Kim et al. | |
| 8,658,057 B2 | 2/2014 | Nakayama et al. | |
| 8,696,932 B2 | 4/2014 | Uchida et al. | |
| 8,697,817 B2 | 4/2014 | Waggoner et al. | |
| 8,778,220 B2 | 7/2014 | Lee et al. | |
| 8,778,222 B2 | 7/2014 | Matsubara et al. | |
| 8,778,247 B2 | 7/2014 | Stoeks et al. | |
| 8,784,683 B2 | 7/2014 | Matsubara et al. | |
| 8,834,741 B2 | 9/2014 | Shiraishi et al. | |
| 8,906,259 B2 | 12/2014 | Kim | |
| 8,926,862 B2 | 1/2015 | Kim et al. | |
| 8,932,483 B2 | 1/2015 | Kim | |
| 8,980,986 B2 | 3/2015 | Lee et al. | |
| 9,018,315 B2 | 4/2015 | Waggoner et al. | |
| 9,045,621 B2 | 6/2015 | Mastsubara et al. | |
| 9,045,685 B2 | 6/2015 | Nair et al. | |
| 9,051,514 B2 | 6/2015 | Nair et al. | |
| 9,074,070 B2 | 7/2015 | Yung et al. | |
| 9,096,794 B2 | 8/2015 | Nair et al. | |
| 9,103,020 B2 | 8/2015 | Gong et al. | |
| 9,109,111 B2 | 8/2015 | Lee et al. | |
| 9,258,892 B2 | 2/2016 | Crosley | |
| 9,284,435 B2 | 3/2016 | Kim | |
| 9,355,753 B2 | 5/2016 | Kim | |
| 9,512,293 B2 | 12/2016 | Kim | |
| 9,822,254 B2 | 11/2017 | Kim | |
| 9,896,566 B2 | 2/2018 | Yung et al. | |
| 9,988,519 B2 | 6/2018 | Kim | |
| 10,106,682 B2 | 10/2018 | Kim | |
| 10,280,282 B2 | 5/2019 | Kim | |
| 10,280,332 B2 | 5/2019 | Moussa et al. | |
| 10,433,428 B2 | 10/2019 | Spiegel et al. | |
| 10,667,407 B2 | 5/2020 | Spiegel et al. | |
| 10,829,634 B2 | 11/2020 | Kim | |
| 10,941,275 B2 | 3/2021 | Kim | |
| 11,136,445 B2 | 10/2021 | Kim | |
| 11,258,184 B2 | 2/2022 | Kim et al. | |
| 2002/0064701 A1 | 5/2002 | Hand et al. | |
| 2002/0190432 A1 | 12/2002 | Shiwaku et al. | |
| 2005/0077498 A1 | 4/2005 | Kato et al. | |
| 2005/0176835 A1 | 8/2005 | Kobayashi et al. | |
| 2005/0191877 A1 | 9/2005 | Huang | |
| 2005/0260361 A1 | 11/2005 | Alms et al. | |
| 2006/0009580 A1 | 1/2006 | Alms et al. | |
| 2006/0014876 A1 | 1/2006 | Bushelman et al. | |
| 2006/0025561 A1 | 2/2006 | Watanabe et al. | |
| 2007/0057236 A1 | 3/2007 | Hosoda et al. | |
| 2007/0190346 A1 | 8/2007 | Ikegawa | |
| 2009/0027586 A1 | 1/2009 | Kumai et al. | |
| 2009/0212684 A1 | 8/2009 | Saito et al. | |
| 2010/0012354 A1 | 1/2010 | Hedin et al. | |
| 2011/0171452 A1 | 7/2011 | Öttinger et al. | |
| 2011/0189454 A1 | 8/2011 | Fukuhara et al. | |
| 2012/0135228 A1 | 5/2012 | Fukuhara et al. | |
| 2012/0199790 A1 | 8/2012 | Yun et al. | |
| 2013/0015411 A1 | 1/2013 | Kang et al. | |
| 2013/0022828 A1 | 1/2013 | Matsubara et al. | |
| 2013/0048909 A1 | 2/2013 | Nair et al. | |
| 2013/0052447 A1 | 2/2013 | Grenci et al. | |
| 2013/0123420 A1 | 5/2013 | Kim | |
| 2013/0200297 A1 | 8/2013 | Saga | |
| 2013/0231436 A1 | 9/2013 | Lee et al. | |
| 2014/0105590 A1* | 4/2014 | Kim ............ | C08K 5/19 396/529 |
| 2014/0128545 A1 | 5/2014 | Xiong et al. | |
| 2014/0142571 A1 | 5/2014 | Yung et al. | |

(56) References Cited

U.S. PATENT DOCUMENTS

| | | | |
|---|---|---|---|
| 2014/0264183 A1 | 9/2014 | Kim | |
| 2015/0175805 A1 | 6/2015 | Schaefer | |
| 2015/0274965 A1 | 10/2015 | Nair et al. | |
| 2017/0051147 A1* | 2/2017 | Kim | C08L 63/00 |
| 2020/0022265 A1* | 1/2020 | Spiegel | H05K 1/0326 |
| 2020/0347303 A1 | 11/2020 | Pan et al. | |
| 2021/0054190 A1 | 2/2021 | Kim | |
| 2021/0057811 A1 | 2/2021 | Kim | |
| 2021/0061994 A1 | 3/2021 | Kim | |
| 2021/0070929 A1 | 3/2021 | Kim et al. | |
| 2021/0189095 A1 | 6/2021 | Kim | |
| 2021/0261755 A1 | 8/2021 | Kim | |
| 2021/0261771 A1 | 8/2021 | Kim | |
| 2021/0265075 A1 | 8/2021 | Kim | |
| 2021/0274652 A1 | 9/2021 | Kim | |
| 2022/0025153 A1 | 1/2022 | Kim | |
| 2022/0127499 A1 | 4/2022 | Kim | |
| 2022/0149541 A1 | 5/2022 | Kim et al. | |

FOREIGN PATENT DOCUMENTS

| | | |
|---|---|---|
| EP | 1 116 769 A2 | 7/2001 |
| EP | 1 116 769 A3 | 7/2001 |
| EP | 1 382 437 A2 | 1/2004 |
| EP | 1 382 437 A3 | 1/2004 |
| EP | 1 699 228 A1 | 9/2006 |
| JP | H 0481451 A | 3/1992 |
| JP | H 05140282 A | 6/1993 |
| JP | H 0718162 A | 1/1995 |
| JP | H 09143347 A | 6/1997 |
| JP | H 09297256 A | 11/1997 |
| JP | H 1160927 A | 3/1999 |
| JP | H 1180517 A | 3/1999 |
| JP | H 1180518 A | 3/1999 |
| JP | H 11147999 A | 6/1999 |
| JP | 2000080289 A | 3/2000 |
| JP | 2000273292 A | 10/2000 |
| JP | 2000273320 A | 10/2000 |
| JP | 2000281885 A | 10/2000 |
| JP | 2004182895 A | 7/2004 |
| JP | 2004263162 A | 9/2004 |
| JP | 2005187696 A | 7/2005 |
| JP | 2008075079 A | 4/2008 |
| JP | 200814573 A | 9/2008 |
| JP | 2009155436 A | 7/2009 |
| JP | 2009242454 A | 10/2009 |
| JP | 2009242455 A | 10/2009 |
| JP | 5172279 B2 | 3/2013 |
| KR | 20120114048 A | 10/2012 |
| KR | 20130047456 A | 5/2013 |
| WO | WO 2005/063889 A1 | 7/2005 |
| WO | WO 2006/104701 A1 | 10/2006 |
| WO | WO 2006/126861 A1 | 11/2006 |
| WO | WO 2009/005317 A2 | 1/2009 |
| WO | WO 2009/005317 A3 | 1/2009 |
| WO | WO 2010/013578 A1 | 2/2010 |
| WO | WO 2012/050082 A1 | 4/2012 |
| WO | WO 2013/032970 A1 | 3/2013 |
| WO | WO 2013/066003 A | 5/2013 |
| WO | WO 2013/074469 A1 | 5/2013 |
| WO | WO 2013/074475 A1 | 5/2013 |
| WO | WO 2013/129338 A1 | 9/2013 |
| WO | WO 2016/003588 A1 | 1/2016 |
| WO | WO 2016/209792 A1 | 12/2016 |
| WO | WO 2017/004064 A1 | 1/2017 |

OTHER PUBLICATIONS

Product Information—Sigrafil® C, The Carbon Fiber for Thermoplastic Compounds from SGL Group, 2009, 4 pages.
Product Information on Talc from Nippon Talc Co., Ltd., 5 pages.
Related Application Form.
International Search Report and Written Opinion for PCT/US2021/041513 dated Oct. 26, 2021, 9 pages.
Article—Möhwald et al., "Laser Beam Activation of CNT-Filled Polymer Blends," *Laser Technik Journal*, Feb. 2015, pp. 52-55 (© 2015 Wiley-VCH Verlag GmbH & Co. KGaA, Weinheim).
Article—Zaderej et al., "ASEP (Application Specific Electronics Package) A Next Generation Electronics Manufacturing Technology," Proceedings of SMTA International, 2018, 8 pages.
Product and Property Guide for DuPont™ Zenite® LCP liquid crystal polymer resin, May 2006, 33 pages.

\* cited by examiner

MOLDED INTERCONNECT DEVICE

CROSS REFERENCE TO RELATED APPLICATIONS

The present application claims filing benefit of U.S. Provisional Patent Application Ser. No. 63/057,345 (filing date of Jul. 28, 2020), 63/057,349 (filing date of Jul. 28, 2020), 63/057,353 (filing date of Jul. 28, 2020), and U.S. patent application Ser. No. 17/178,292 (filing date of Feb. 18, 2021), Ser. No. 17/178,295 (filing date of Feb. 18, 2021), Ser. No. 17/178,312 (filing date of Feb. 18, 2021), and Ser. No. 17/184,948 (filing date of Feb. 25, 2021), all of which are incorporated herein by reference.

BACKGROUND OF THE INVENTION

To form various electronic components, molded interconnect devices (MIDs) are often formed that contain a plastic substrate on which is formed conductive elements or pathways. Such MID devices are thus three-dimensional molded parts having an integrated printed conductor or circuit layout. MIDs are typically formed using a laser direct structuring ("LDS") process during which a computer-controlled laser beam travels over the plastic substrate to activate its surface at locations where the conductive path is to be situated. Various materials have been proposed for forming the plastic substrate of a laser direct structured device. For example, one such material is a blend of polycarbonate, acrylonitrile butadiene styrene, and copper chromite ($Cu_2CrO_4$). During the laser direct structuring process, the copper chromite is cracked open to release metal atoms, which can act as a nuclei for crystal growth during a subsequent electroless copper plating process. Despite its benefits, one of the limitations of laser direct structured materials is that the spinel crystals tend to adversely impact the performance of the composition in certain circumstances. Furthermore, it is becoming increasingly desirable to minimize the use of heavy metals, such as copper and chromium, due to potential environmental concerns. As such, a need currently exists for a molded interconnect device in which the conductive elements can be readily formed without the use of conventional LDS processes.

SUMMARY OF THE INVENTION

In accordance with one embodiment of the present invention, a molded interconnect device is disclosed that comprises a substrate and conductive elements disposed on the substrate. The substrate comprises a polymer composition containing a polymer matrix that includes a thermotropic liquid crystalline polymer and from about 10 parts to about 80 parts by weight of a mineral filler per 100 parts by weight of the polymer matrix. The mineral filler has an average diameter of about 25 micrometers or less. The polymer composition contains copper in an amount of about 1,000 parts per million or less and chromium in an amount of about 2,000 parts per million or less, and further exhibits a surface resistivity of about $1 \times 10^{14}$ ohm or more as determined in accordance with IEC 62631-3-1:2016.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
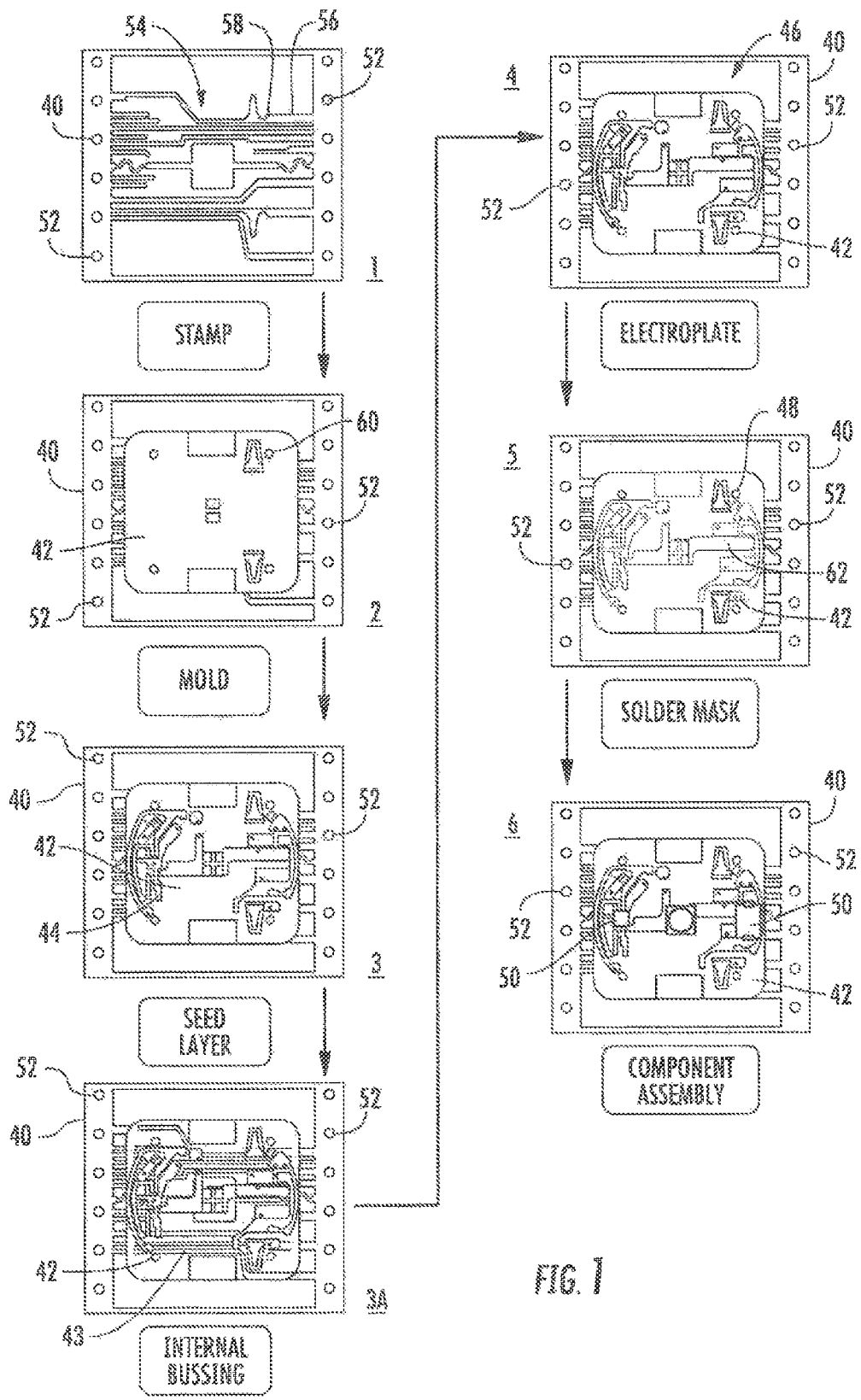
FIG. 1 is a flow diagram of one embodiment of a manufacturing process that may be employed to form an electronic device.

It is to be understood by one of ordinary skill in the art that the present discussion is a description of exemplary embodiments only, and is not intended as limiting the broader aspects of the present invention.

Generally speaking, the present invention is directed a molded interconnect device that contains a substrate and conductive elements disposed thereon. The substrate contains a polymer composition that includes a mineral filler and a polymer matrix containing a thermotropic liquid crystalline polymer. By selectively controlling the specific nature of these and other components of the polymer composition along with their relative concentration, the present inventor has discovered that the resulting composition is capable of being readily plated without the use of a conventional laser direct structuring system. For example, the mineral filler may have a size that is small enough so that it does not substantially interfere with the technique used to form an interconnect pattern on the substrate (e.g., laser ablation). More particularly, the mineral filler may have a median diameter of about 25 micrometers or less, in some embodiments from about 0.1 to about 15 micrometers, in some embodiments from about 0.5 to about 14 micrometers, and in some embodiments, from about 1 to about 13 micrometers, such as determined by a laser diffraction analyzer (e.g., Microtrac S3500). In addition to not interfering with the creation of an interconnect pattern, it is believed that mineral fillers having the size characteristics noted above can also more readily move through molding equipment, which enhances the distribution within the polymer matrix and minimizes the creation of surface defects.

Because the substrate can be plated without the use of a laser direct structuring system, the polymer composition can beneficially be formed without the use of copper chromite ($CuCr_2O_4$) as a laser activatable additive. In this regard, the resulting polymer composition may be generally free of chromium and/or copper. For example, chromium may be present in the composition in an amount of about 2,000 parts per million ("ppm") or less, in some embodiments from about 1,500 ppm or less, in some embodiments about 1,000 ppm or less, and in some embodiments, from about 0.001 to about 500 ppm, while copper is generally present in the composition in an amount of about 1,000 ppm or less, in some embodiments from about 750 ppm or less, in some embodiments about 500 ppm or less, and in some embodiments, from about 0.001 to about 100 ppm. The content of copper and chromium may be determined using known techniques, such as by X-ray fluoroscopy (e.g., Innov-X Systems Model a-2000 X-ray fluorescence spectrometer with a Si-PiN diode detector). Of course, apart from copper chromite, the polymer composition may also be generally free of other types of conventional laser activatable additives, such as spinel crystals having the formula, $AB_2O_4$, wherein A is a metal cation having a valance of 2 (e.g., cadmium, chromium, manganese, nickel, zinc, copper, cobalt, iron, magnesium, tin, or titanium) and B is a metal cation having a valance of 3 (e.g., chromium, iron, aluminum, nickel, manganese, or tin) (e.g., $MgAl_2O_4$, $ZnAl_2O_4$, $FeAl_2O_4$, $CuFe_2O_4$, $MnFe_2O_4$, $NiFe_2O_4$, $TiFe_2O_4$, $FeCr_2O_4$, or $MgCr_2O_4$). The polymer composition may be free of such spinel crystals (i.e., 0 wt. %), or such crystals may be present in only a small concentration, such as in an amount of about 1 wt. % or less, in some embodiments about 0.5 wt. % or less, and in some embodiments, from about 0.001 wt. % to about 0.2 wt. %.

The polymer composition may also exhibit a relatively high degree of electrical resistance to help provide the substrate with good insulative properties for use in the molded interconnect device. The surface resistivity may, for instance, be about $1 \times 10^{14}$ ohms or more, in some embodiments about $1 \times 10^{15}$ ohms or more, in some embodiments about $1 \times 10^{16}$ ohms or more, and in some embodiments, about $1 \times 10^{17}$ ohms or more, such as determined at a temperature of about 20° C. in accordance with IEC 62631-3-1:2016. The volume resistivity may likewise be about $1 \times 10^{12}$ ohm-m or more, in some embodiments about $1 \times 10^{13}$ ohm-m or more, in some embodiments about $1 \times 10^{14}$ ohm-m or more, and in some embodiments, about $1 \times 10^{15}$ ohm-m or more, such as determined at a temperature of about 20° C. in accordance with IEC 62631-3-1:2016. To help achieve such values, it is generally desired that the composition is generally free of conventional materials having a high degree of electrical conductivity. For example, the polymer composition may be generally free of electrically conductive fillers having an intrinsic volume resistivity of less than about 1 ohm-cm, in some embodiments about less than about 0.1 ohm-cm, and in some embodiments, from about $1 \times 10^{-8}$ to about $1 \times 10^{-2}$ ohm-cm, such as determined at a temperature of about 20° C. Examples of such electrically conductive fillers may include, for instance, electrically conductive carbon materials such as, graphite, electrically conductive carbon black, carbon fibers, graphene, carbon nanotubes, etc.; metals (e.g., metal particles, metal flakes, metal fibers, etc.); ionic liquids; and so forth. While it is normally desired to minimize the presence of such electrically conductive materials, they may nevertheless be present in a relatively small percentage in certain embodiments, such as in an amount of about 5 wt. % or less, in some embodiments about 2 wt. % or less, in some embodiments about 1 wt. % or less, in some embodiments about 0.5 wt. % or less, and in some embodiments, from about 0.001 wt. % to about 0.2 wt. % of the polymer composition.

Various embodiments of the present invention will now be described in more detail.

I. Polymer Composition

A. Polymer Matrix

The polymer matrix typically contains one or more liquid crystalline polymers, generally in an amount of from about 30 wt. % to about 90 wt. %, in some embodiments from about 30 wt. % to about 80 wt. %, in some embodiments from about 40 wt. % to about 75 wt. %, and in some embodiments, from about 50 wt. % to about 70 wt. % of the polymer composition. The liquid crystalline polymers are generally classified as "thermotropic" to the extent that they can possess a rod-like structure and exhibit a crystalline behavior in their molten state (e.g., thermotropic nematic state). The polymers have a relatively high melting temperature, such as about 280° C. or more, in some embodiments from about 280° C. to about 400° C., in some embodiments from about 290° C. to about 390° C., and in some embodiments, from about 300° C. to about 380° C. Such polymers may be formed from one or more types of repeating units as is known in the art. A liquid crystalline polymer may, for example, contain one or more aromatic ester repeating units generally represented by the following Formula (I):

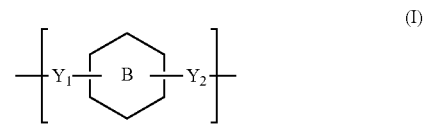

wherein, ring B is a substituted or unsubstituted 6-membered aryl group (e.g., 1,4-phenylene or 1,3-phenylene), a substituted or unsubstituted 6-membered aryl group fused to a substituted or unsubstituted 5- or 6-membered aryl group (e.g., 2,6-naphthalene), or a substituted or unsubstituted 6-membered aryl group linked to a substituted or unsubstituted 5- or 6-membered aryl group (e.g., 4,4-biphenylene); and $Y_1$ and $Y_2$ are independently O, C(O), NH, C(O)HN, or NHC(O).

Typically, at least one of $Y_1$ and $Y_2$ are C(O). Examples of such aromatic ester repeating units may include, for instance, aromatic dicarboxylic repeating units ($Y_1$ and $Y_2$ in Formula I are C(O)), aromatic hydroxycarboxylic repeating units ($Y_1$ is O and $Y_2$ is C(O) in Formula I), as well as various combinations thereof.

Aromatic hydroxycarboxylic repeating units, for instance, may be employed that are derived from aromatic hydroxycarboxylic acids, such as, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof, and combination thereof. Particularly suitable aromatic hydroxycarboxylic acids are 4-hydroxybenzoic acid ("HBA") and 6-hydroxy-2-naphthoic acid ("HNA"). When employed, repeating units derived from hydroxycarboxylic acids (e.g., HBA and/or HNA) typically constitute about 40 mol. % or more, in some embodiments about 45 mol. % or more, and in some embodiments, from about 50 mol. % to 100 mol. % of the polymer. In one embodiment, for example, repeating units derived from HBA may constitute from about 30 mol. % to about 90 mol. % of the polymer, in some embodiments from about 40 mol. % to about 85 mol. % of the polymer, and in some embodiments, from about 50 mol. % to about 80 mol. % of the polymer. Repeating units derived from HNA may likewise constitute from about 1 mol. % to about 30 mol. % of the polymer, in some embodiments from about 2 mol. % to about 25 mol. % of the polymer, and in some embodiments, from about 3 mol. % to about 15 mol. % of the polymer.

Aromatic dicarboxylic repeating units may also be employed that are derived from aromatic dicarboxylic acids, such as terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl) ether, bis(4-carboxyphenyl)butane, bis(4-carboxyphenyl) ethane, bis(3-carboxyphenyl)ether, bis(3-carboxyphenyl) ethane, etc., as well as alkyl, alkoxy, aryl and halogen substituents thereof, and combinations thereof. Particularly suitable aromatic dicarboxylic acids may include, for instance, terephthalic acid ("TA"), isophthalic acid ("IA"), and 2,6-naphthalenedicarboxylic acid ("NDA"). When employed, repeating units derived from aromatic dicarboxylic acids (e.g., IA, TA, and/or NDA) typically constitute from about 1 mol. % to about 50 mol. %, in some embodiments from about 2 mol. % to about 40 mol. %, and in some embodiments, from about 5 mol. % to about 30 mol. % of the polymer.

Other repeating units may also be employed in the polymer. In certain embodiments, for instance, repeating units may be employed that are derived from aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl (or 4,4'-biphenol), 3,3'-dihydroxybiphenyl, 3,4'-dihydroxybiphenyl, 4,4'-dihydroxybiphenyl ether, bis(4-hydroxyphenyl)ethane, etc., as well as alkyl, alkoxy, aryl and halogen substituents thereof, and combinations thereof. Particularly suitable aromatic diols may include, for instance, hydroquinone ("HQ") and 4,4'-biphenol ("BP"). When employed, repeating units derived from aromatic diols (e.g., HQ and/or BP) typically constitute from about 1 mol. % to about 30 mol. %, in some embodiments from about 2 mol. % to about 25 mol. %, and in some embodiments, from about 5 mol. % to about 20 mol. % of the polymer. Repeating units may also be employed, such as those derived from aromatic amides (e.g., acetaminophen ("APAP")) and/or aromatic amines (e.g., 4-aminophenol ("AP"), 3-aminophenol, 1,4-phenylenediamine, 1,3-phenylenediamine, etc.). When employed, repeating units derived from aromatic amides (e.g., APAP) and/or aromatic amines (e.g., AP) typically constitute from about 0.1 mol. % to about 20 mol. %, in some embodiments from about 0.5 mol. % to about 15 mol. %, and in some embodiments, from about 1 mol. % to about 10 mol. % of the polymer. It should also be understood that various other monomeric repeating units may be incorporated into the polymer. For instance, in certain embodiments, the polymer may contain one or more repeating units derived from non-aromatic monomers, such as aliphatic or cycloaliphatic hydroxycarboxylic acids, dicarboxylic acids, diols, amides, amines, etc. Of course, in other embodiments, the polymer may be "wholly aromatic" in that it lacks repeating units derived from non-aromatic (e.g., aliphatic or cycloaliphatic) monomers.

Although not necessarily required, the liquid crystalline polymer may be a "low naphthenic" polymer to the extent that it contains a relatively low content of repeating units derived from naphthenic hydroxycarboxylic acids and naphthenic dicarboxylic acids, such as naphthalene-2,6-dicarboxylic acid ("NDA"), 6-hydroxy-2-naphthoic acid ("HNA"), or combinations thereof. That is, the total amount of repeating units derived from naphthenic hydroxycarboxylic and/or dicarboxylic acids (e.g., NDA, HNA, or a combination of HNA and NDA) is typically about 15 mol. % or less, in some embodiments about 10 mol. % or less, and in some embodiments, from about 1 mol. % to about 8 mol. % of the polymer.

B. Mineral Filler

As noted above, the polymer composition also contains one or more mineral fillers distributed within the polymer matrix. Such mineral fillers typically constitute from about 10 to about 80 parts, in some embodiments from about 20 to about 70 parts, and in some embodiments, from about 30 to about 60 parts per 100 parts by weight of the polymer matrix. The mineral filler may, for instance, constitute from about 5 wt. % to about 70 wt. %, in some embodiments from about 10 wt. % to about 60 wt. %, in some embodiments from about 10 wt. % to about 55 wt. %, and in some embodiments, from about 25 wt. % to about 40 wt. % of the polymer composition.

The nature of the mineral filler employed in the polymer composition may vary, such as mineral particles, mineral fibers (or "whiskers"), etc., as well as blends thereof. Suitable mineral fibers may, for instance, include those that are derived from silicates, such as neosilicates, sorosilicates, inosilicates (e.g., calcium inosilicates, such as wollastonite; calcium magnesium inosilicates, such as tremolite; calcium magnesium iron inosilicates, such as actinolite; magnesium iron inosilicates, such as anthophyllite; etc.), phyllosilicates (e.g., aluminum phyllosilicates, such as palygorskite), tectosilicates, etc.; sulfates, such as calcium sulfates (e.g., dehydrated or anhydrous gypsum); mineral wools (e.g., rock or slag wool); and so forth. Particularly suitable are inosilicates (e.g., calcium inosilicate or $CaSiO_3$), such as wollastonite fibers available from Nyco Minerals under the trade designation NYGLOS® (e.g., NYGLOS® 4 W or NYGLOS® 8). Such wollastonite fibers may, for instance, contain approximately 50% CaO, approximately 50% $SiO_2$, and various other trace components, such as $Fe_2O_3$, $Al_2O_3$, MnO, MgO, $TiO_2$, and $K_2O$. As noted, the mineral fibers generally have a small size, such as a median diameter of about 25 micrometers or less, in some embodiments from about 0.1 to about 15 micrometers, in some embodiments from about 0.5 to about 14 micrometers, and in some embodiments, from about 1 to about 13 micrometers, such as determined by a laser diffraction analyzer (e.g., Microtrac S3500). The mineral fibers may also have a narrow size distribution. That is, at least about 60% by volume of the fibers, in some embodiments at least about 70% by volume of the fibers, and in some embodiments, at least about 80% by volume of the fibers may have a size within the ranges noted above. In addition to possessing a small median diameter as noted above, the mineral fibers may also have a relatively high aspect ratio (median length divided by median diameter) to help further improve the properties of the resulting polymer composition. For example, the mineral fibers may have an aspect ratio of from about 1.1 to about 100, in some embodiments from about 2 to about 50, in some embodiments from about 4 to about 30, and in some embodiments, from about 8 to about 20. The median length of such mineral fibers may, for example, range from about 1 to about 300 micrometers, in some embodiments from about 5 to about 250 micrometers, in some embodiments from about 40 to about 220 micrometers, and in some embodiments, from about 60 to about 200 micrometers, such as determined by a laser diffraction analyzer (e.g., Microtrac S3500).

Other suitable mineral fillers are mineral particles. As noted, the mineral particles may have a median diameter of about 25 micrometers or less, in some embodiments from about 0.1 to about 15 micrometers, in some embodiments from about 0.5 to about 14 micrometers, and in some embodiments, from about 1 to about 13 micrometers, such as determined by a laser diffraction analyzer (e.g., Microtrac S3500). The shape of the particles may vary as desired, such as granular, flake-shaped, etc. Flake-shaped particles, for instance, may be employed that have a relatively high aspect ratio (e.g., average diameter divided by average thickness), such as about 4 or more, in some embodiments about 8 or more, and in some embodiments, from about 10 to about 500. The average thickness of such flake-shaped particles may likewise be about 2 micrometers or less, in some embodiments from about 5 nanometers to about 1 micrometer, and in some embodiments, from about 20 nanometers to about 500 nanometers. Regardless of their shape and size, the particles are typically formed from a natural and/or synthetic silica or silicate mineral, such as talc, mica, halloysite, kaolinite, illite, montmorillonite, vermiculite, palygorskite, pyrophyllite, calcium silicate, aluminum silicate, wollastonite, silica, etc. Talc, mica, and silica are particularly suitable. Any form of mica may generally be employed, including, for instance, muscovite ($KAl_2(AlSi_3)O_{10}(OH)_2$), biotite ($K(Mg,Fe)_3(AlSi_3)O_{10}(OH)_2$), phlogopite ($KMg_3(AlSi_3)O_{10}(OH)_2$), lepidolite ($K(Li,Al)_{2-3}(AlSi_3)O_{10}(OH)_2$), glauconite ($(K,Na)(Al,Mg,Fe)_2(Si,Al)_4O_{10}(OH)_2$), etc. Muscovite-based mica is particularly suitable for use in the polymer composition.

By selectively tailoring the type and relative amount of the mineral filler, the present inventor has not only discovered that the polymer composition can be plated, but also that the thermal conductivity can be increased without significantly impacting other properties of the polymer composition. Among other things, this allows the composition to be capable of creating a thermal pathway for heat transfer away from the resulting electronic device so that "hot spots" can be quickly eliminated and the overall temperature can be lowered during use. The composition may, for example, exhibit an in-plane thermal conductivity of about 1 W/m-K or more, in some embodiments about 1.2 W/m-K or more, in some embodiments about 1.5 W/m-K or more, in some embodiments about 1.8 W/m-K or more, and in some embodiments, from about 2 to about 5 W/m-K, as determined in accordance with ASTM E 1461-13. The composition may also exhibit a through-plane thermal conductivity of about 0.2 W/m-K or more, in some embodiments about 0.3 W/m-K or more, in some embodiments about 0.4 W/m-K or more, and in some embodiments, from about 0.5 to about 2 W/m-K, as determined in accordance with ASTM E 1461-13. Notably, it has been discovered that such a thermal conductivity can be achieved without use of conventional materials having a high degree of intrinsic thermal conductivity. For example, the polymer composition may be generally free of fillers having an intrinsic thermal conductivity of 50 W/m-K or more, in some embodiments 100 W/m-K or more, and in some embodiments, 150 W/m-K or more. Examples of such high intrinsic thermally conductive materials may include, for instance, boron nitride, aluminum nitride, magnesium silicon nitride, graphite (e.g., expanded graphite), silicon carbide, carbon nanotubes, zinc oxide, magnesium oxide, beryllium oxide, zirconium oxide, yttrium oxide, aluminum powder, and copper powder. While it is normally desired to minimize the presence of such high intrinsic thermally conductive materials, they may nevertheless be present in a relatively small percentage in certain embodiments, such as in an amount of about 5 wt. % or less, in some embodiments about 2 wt. % or less, in some embodiments about 1 wt. % or less, in some embodiments about 0.5 wt. % or less, and in some embodiments, from about 0.001 wt. % to about 0.2 wt. % of the polymer composition.

C. Optional Components

A wide variety of additional additives can also be included in the polymer composition, such as glass fibers, impact modifiers, lubricants, pigments (e.g., carbon black), antioxidants, stabilizers, surfactants, waxes, flame retardants, anti-drip additives, nucleating agents (e.g., boron nitride), and other materials added to enhance properties and processability. Lubricants, for example, may be employed in the polymer composition in an amount from about 0.05 wt. % to about 1.5 wt. %, and in some embodiments, from about 0.1 wt. % to about 0.5 wt. % (by weight) of the polymer composition. Examples of such lubricants include fatty acids esters, the salts thereof, esters, fatty acid amides, organic phosphate esters, and hydrocarbon waxes of the type commonly used as lubricants in the processing of engineering plastic materials, including mixtures thereof. Suitable fatty acids typically have a backbone carbon chain of from about 12 to about 60 carbon atoms, such as myristic acid, palmitic acid, stearic acid, arachic acid, montanic acid, octadecinic acid, parinric acid, and so forth. Suitable esters include fatty acid esters, fatty alcohol esters, wax esters, glycerol esters, glycol esters and complex esters. Fatty acid amides include fatty primary amides, fatty secondary amides, methylene and ethylene bisamides and alkanolamides such as, for example, palmitic acid amide, stearic acid amide, oleic acid amide, N,N'-ethylenebisstearamide and so forth. Also suitable are the metal salts of fatty acids such as calcium stearate, zinc stearate, magnesium stearate, and so forth; hydrocarbon waxes, including paraffin waxes, polyolefin and oxidized polyolefin waxes, and microcrystalline waxes. Particularly suitable lubricants are acids, salts, or amides of stearic acid, such as pentaerythritol tetrastearate, calcium stearate, or N, N'-ethylenebisstearamide.

The components of the polymer composition (e.g., liquid crystalline polymer(s), mineral filler(s), etc.) may be melt processed or blended together. The components may be supplied separately or in combination to an extruder that includes at least one screw rotatably mounted and received within a barrel (e.g., cylindrical barrel) and may define a feed section and a melting section located downstream from the feed section along the length of the screw. The extruder may be a single screw or twin screw extruder. The speed of the screw may be selected to achieve the desired residence time, shear rate, melt processing temperature, etc. For example, the screw speed may range from about 50 to about 800 revolutions per minute ("rpm"), in some embodiments from about 70 to about 150 rpm, and in some embodiments, from about 80 to about 120 rpm. The apparent shear rate during melt blending may also range from about 100 seconds$^{-1}$ to about 10,000 seconds$^{-1}$, in some embodiments from about 500 seconds$^{-1}$ to about 5000 seconds$^{-1}$, and in some embodiments, from about 800 seconds$^{-1}$ to about 1200 seconds$^{-1}$. The apparent shear rate is equal to $4Q/\pi R^3$, where Q is the volumetric flow rate ("m$^3$/s") of the polymer melt and R is the radius ("m") of the capillary (e.g., extruder die) through which the melted polymer flows. Regardless of the particular manner in which it is formed, the resulting polymer composition can possess excellent thermal properties. For example, the melt viscosity of the polymer composition may be low enough so that it can readily flow into the cavity of a mold having small dimensions. In one particular embodiment, the polymer composition may have a melt viscosity of from about 10 to about 250 Pa-s, in some embodiments from about 15 to about 200 Pa-s, in some embodiments from about 20 to about 150 Pa-s, and in some embodiments, from about 30 to about 100 Pa-s, determined at a shear rate of 1,000 seconds$^{-1}$. Melt viscosity may be determined in accordance with ISO Test No. 11443:2014 at a temperature that is 15° C. higher than the melting temperature of the composition (e.g., about 340° C. for a melting temperature of about 325° C.).

II. Substrate

As indicated above, the polymer composition is employed in a substrate that has conductive elements plated thereon. The substrate may be formed using a variety of different molding techniques. Suitable techniques may include, for instance, injection molding, low-pressure injection molding, extrusion compression molding, gas injection molding, foam injection molding, low-pressure gas injection molding, low-pressure foam injection molding, gas extrusion compression molding, foam extrusion compression molding, extrusion molding, foam extrusion molding, compression molding, foam compression molding, gas compression molding, etc. For example, an injection molding system may be employed that includes a mold within which the polymer composition may be injected. The time inside the injector may be controlled and optimized so that polymer matrix is not pre-solidified. When the cycle time is reached and the barrel is full for discharge, a piston may be used to inject the composition to the mold cavity. Compression molding systems may also be employed. As with injection molding, the shaping of the polymer composition into the desired article also occurs within a mold. The composition may be placed into the compression mold using any known technique, such as by being picked up by an automated robot arm. The temperature of the mold may be maintained at or above the solidification temperature of the polymer matrix for a desired time period to allow for solidification. The molded product may then be solidified by bringing it to a temperature below that of the melting temperature. The resulting product may be de-molded. The cycle time for each molding process may be adjusted to suit the polymer matrix, to achieve sufficient bonding, and to enhance overall process productivity.

The resulting polymer composition may exhibit a variety of beneficial mechanical properties. For example, the composition may exhibit a Charpy unnotched impact strength of about 10 kJ/m$^2$, in some embodiments from about 15 to about 60 kJ/m$^2$, and in some embodiments, from about 20 to about 50 kJ/m$^2$, measured at 23° C. according to ISO Test No. 179-1:2010. The composition may also exhibit a tensile strength of from about 20 to about 500 MPa, in some embodiments from about 50 to about 400 MPa, and in some embodiments, from about 60 to about 350 MPa; tensile break strain of about 0.5% or more, in some embodiments from about 0.8% to about 15%, and in some embodiments, from about 1% to about 10%; and/or tensile modulus of from about 5,000 MPa to about 30,000 MPa, in some embodiments from about 7,000 MPa to about 25,000 MPa, and in some embodiments, from about 10,000 MPa to about 20,000 MPa. The tensile properties may be determined in accordance with ISO Test No. 527:2019 at 23° C. The composition may also exhibit a flexural strength of from about 40 to about 500 MPa, in some embodiments from about 50 to about 400 MPa, and in some embodiments, from about 100 to about 350 MPa; flexural break strain of about 0.5% or more, in some embodiments from about 0.8% to about 15%, and in some embodiments, from about 1% to about 10%; and/or flexural modulus of about 7,000 MPa or more, in some embodiments from about 9,000 MPa or more, in some embodiments, from about 10,000 MPa to about 30,000 MPa, and in some embodiments, from about 12,000 MPa to about 25,000 MPa. The flexural properties may be determined in accordance with ISO Test No. 178:2019 at 23° C. The composition may also exhibit a deflection temperature under load (DTUL) of about 180° C. or more, and in some embodiments, from about 190° C. to about 280° C., as measured according to ASTM D648-07 (technically equivalent to ISO Test No. 75-2:2013) at a specified load of 1.8 MPa.

In certain cases, the polymer composition may also have good electrical properties, particularly when it is desired to employ the molded interconnect device in an antenna system. For example, the polymer composition may exhibit a high dielectric constant of about 4 or more, in some embodiments about 5 or more, in some embodiments about 6 or more, in some embodiments from about 8 to about 30, in some embodiments from about 10 to about 25, and in some embodiments, from about 12 to about 24, as determined by the split post resonator method at a frequency of 2 GHz. Such a high dielectric constant can facilitate the ability to form a thin substrate and also allow multiple conductive elements (e.g., antennae) to be employed that operate simultaneously with only a minimal level of electrical interference. The dissipation factor, a measure of the loss rate of energy, may also be relatively low, such as about 0.3 or less, in some embodiments about 0.2 or less, in some embodiments about 0.1 or less, in some embodiments about 0.06 or less, in some embodiments about 0.04 or less, and in some embodiments, from about 0.001 to about 0.03, as determined by the split post resonator method at a frequency of 2 GHz. Notably, the dielectric constant and dissipation factor can be maintained within the ranges noted above even when exposed to various temperatures, such as a temperature of from about −30° C. to about 100° C. For example, when subjected to a heat cycle test as described herein, the ratio of the dielectric constant after heat cycling to the initial dielectric constant may be about 0.8 or more, in some embodiments about 0.9 or more, and in some embodiments, from about 0.95 to about 1.1. Likewise, the ratio of the dissipation factor after being exposed to the high temperature to the initial dissipation factor may be about 1.3 or less, in some embodiments about 1.2 or less, in some embodiments about 1.1 or less, in some embodiments about 1.0 or less, in some embodiments about 0.95 or less, in some embodiments from about 0.1 to about 0.95, and in some embodiments, from about 0.2 to about 0.9. The change in dissipation factor (i.e., the initial dissipation factor−the dissipation factor after heat cycling) may also range from about −0.1 to about 0.1, in some embodiments from about −0.05 to about 0.01, and in some embodiments, from about −0.001 to 0.

III. Conductive Elements

One or more conductive elements may be deposited on the substrate using any of a variety of known metal deposition techniques, such as plating (e.g., electrolytic plating, electroless plating, etc.), printing (e.g., digital printing, aerosol jet printing, etc.), and so forth. The conductive elements may contain one or more of a variety of conductive materials, such as a metal, e.g. gold, silver, nickel, aluminum, copper, as well as mixture or alloys thereof. In one embodiment, for instance, the conductive elements may include copper and/or nickel (e.g., pure or alloys thereof). If desired, a seed layer may initially be formed on the substrate to facilitate the metal deposition process. When plating is employed as a deposition technique, the process may vary as desired. In certain embodiments, for instance, the process may include initially forming a pattern on the surface of the substrate based on the desired circuit interconnect pattern. This may be accomplished using various known techniques, such as laser ablation or patterning, plasma etching, ultraviolet light treatment, acid etching, etc.

Regardless, after forming the desired pattern on the substrate, the patterned regions may then optionally be subjected to an activation process to prepare for subsequent metal deposition. During this process, the patterned substrate may be contacted with an activation solution that contains a metal, such as palladium, platinum, iridium, rhodium, etc., as well as mixtures thereof. Palladium is particularly suitable. Once the surface has been conditioned as described above, a first metal layer may then be formed thereon on the patterned substrate, such as through a electroless and/or electrolytic plating. Electroless plating may occur through auto-catalytic reactions in which the metal deposited on the surface acts as a catalyst for further depositing. Typically, nickel and/or copper are electrolessly plated onto the surface of the patterned substrate. Electroless nickel plating may be accomplished, for example, using a solution that contains a nickel salt (e.g., nickel sulfate). Electrolytic plating may also be employed during which the patterned substrate is contacted with a metal solution and subjected to an electrical current to initiate deposition of the metal. If desired, the patterned substrate may also be subjected to one or more additional steps to form the final metal coating layer(s). For example, a second metal layer may be electrolytically deposited over the first metal layer (e.g., electrolytically and/or electrolessly plated copper and/or nickel). The second metal layer may include, for instance, copper or nickel. In certain embodiments, one or more additional metal layer(s), such as copper and/or nickel, may also be electrolytically deposited over the second metal layer.

Figure 4:
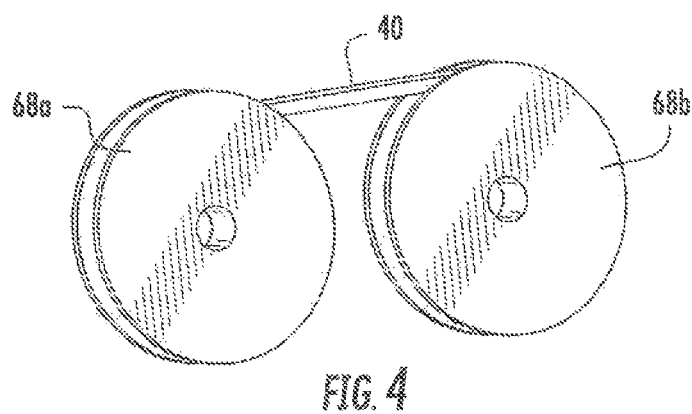
FIG. 4 is a perspective view of one embodiment of a reel-to-reel carrier that may be used in the manufacturing process shown in FIG. 1.
Figure 5:
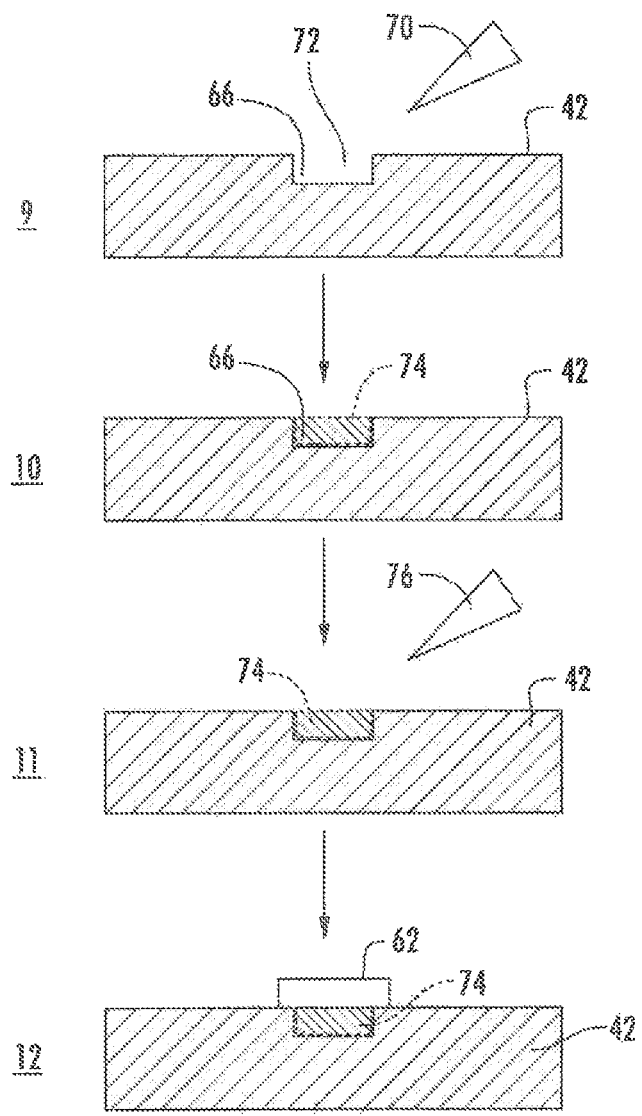
FIG. 5 is a schematic view of one embodiment for forming conductive elements on a substrate.

Referring to FIGS. 1, 4 and 5, one embodiment of a process for forming the molded interconnect device with a substrate and conductive elements is shown in more detail. As shown in Step 1 of FIG. 1, a carrier 40 is provided that contains an outer region from which arms 56 extend to form a leadframe 54. As shown in FIG. 4, the carrier 40 may, for example, be unspooled from a bulk source reel 68a and then collected in a second reel 68b. The carrier 40 is typically formed from a metal (e.g., copper or copper alloy) or other suitable conductive material. If desired, the arms 56 may also contain apertures 58 provided therein. Carrier holes 52 may likewise located on the outer portions of the carrier 40 to allow it to traverse along a manufacturing line in a continuous manner. In Step 2 of FIG. 1, a substrate 42, which may be formed from the polymer composition of the present invention, may thereafter be molded (e.g., overmolded) over the leadframe 54. Apertures 60 may be provided in the substrate 42 that correspond to the apertures 58 in the fingers 56.

Once the substrate 42 is molded over the leadframe 54, conductive elements (circuit traces) may then be formed. Such conductive elements may be formed through a variety of known metal deposition techniques, such as by plating (e.g., electroplating, electroless plating, etc.), printing (e.g., digital printing, aerosol jet printing, etc.), and so forth. If desired, a seed layer may initially be formed on the substrate to facilitate the metal deposition process. In Steps 3 and 3A of FIG. 1, for instance, a seed layer 44 may initially be deposited on the surface of the substrate 42, which allows an internal bus bar 43 formed by the carrier 40 to be electrically connected to the seed layer 44. In step 4, seed layer 44 may then be deposited with a metal (e.g., copper, nickel, gold, silver, tin, lead, palladium, etc.) to form a part 46 containing conductive elements 62. In one embodiment, for instance, electrolytic plating may be performed by applying a voltage potential to the carrier 40 and thereafter placed in an electroplating bath. Vias can also be optionally molded into the surface of the substrate to create an electrical path between the conductive elements (traces) and the internal layers of the circuit. These conductive elements create an "electrical bus bar" to the carrier portion, which enables them to be plated after the deposited conductive paste is applied. If desired, the surface of the substrate may be roughened prior to being plated using a variety of known techniques, such as laser ablation, plasma etching, ultraviolet light treatment, fluorination, etc. Among other things, such roughening helps facilitating plating in the desired interconnect pattern. Referring to FIG. 5, for example, one embodiment of a process that employs a laser for this purpose is illustrated in more detail. More particularly, as shown in Step 9 of FIG. 5, a laser 70 may be initially employed to ablate the surface of the substrate 42 to create a channel 72 that forms an interconnect pattern 66. In Step 10 of FIG. 5, an electrically conductive paste 74 may then be disposed within the channel 72 as a seed layer via any known technique, such as by an inkjet process, aerosol process, or screening process. Alternatively, a plating process (e.g., electroless plating) may also be employed in lieu of and/or in addition to the use of a paste to form the seed layer. When employed, however, the deposited paste 74 may optionally be sintered through a laser or flash heat 76 as illustrated in Step 11 of FIG. 5 to help ensure that the paste 74 sufficiently adheres to the substrate 42. Once optionally sintered, the paste 74 is then plated with a metal (e.g., electrolytically plated) as shown in Step 12 of FIG. 5 to form conductive elements 62 (electronic circuit traces).

IV. Electronic Component

The molded interconnect device of the present invention may be employed in a wide variety of electronic components, such as a printed circuit board, flex circuit, connector, thermal management feature, EMI shielding, high current conductor, RFID apparatus, antenna, wireless power device, sensor, MEMS apparatus, LED device, microprocessor, memory device, ASIC, passive device, impedance control device, electro-mechanical apparatus, sensors, or a combination thereof. In certain embodiments, the substrate of the electronic component may be molded onto a "singulated carrier portion", which generally means that the carrier portion has been separated from a larger carrier (e.g., conjoined or continuous).

Figure 2:
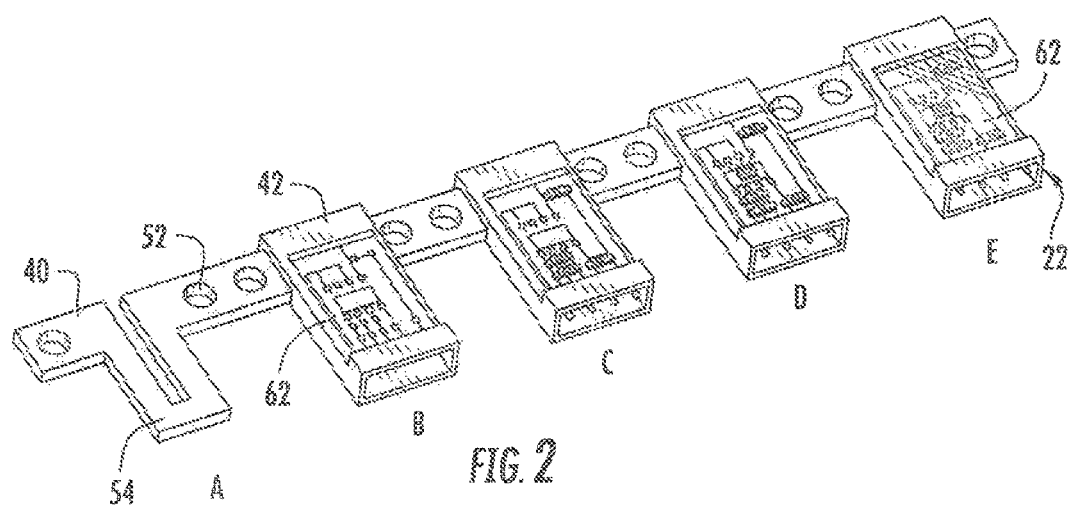
FIG. 2 is a perspective view of the manufacturing process shown in FIG. 1 in which a substrate is shown at various stages on a carrier during formation of the electronic device.
Figure 3:
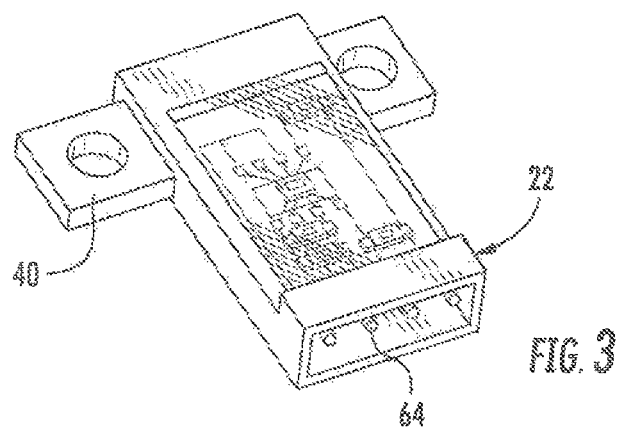
FIG. 3 is a perspective view of the electronic device shown in FIG. 2 after separation from the carrier.

Referring again to FIG. 1, for example, an electronic component may be formed by connecting one or more additional portions 50 to the substrate 42 (Step 6) using any of a variety of techniques, such as soldering, wire bonding, etc. In certain embodiments, a solder mask 48 may optionally be applied (Step 5) prior to the connection of the portions 50. The resulting electronic component may then be separated from the carrier 40. FIGS. 2-3, for instance, illustrate one embodiment of an electronic component 22 during various stages of its formation. At Step A, for instance, the carrier 40 is shown prior to molding. Step B shows the substrate 42 after it has been molded onto the carrier portion 40 and applied with conductive elements 62. At Steps C and D, optional pin contacts and circuit metallization may be added to form the completed electronic device (Step E). The completed electronic component 22 may then be separated from the adjoined carrier 40 as illustrated in FIG. 3 to form an electronic component 22 containing a singulated carrier portion 40. The resulting electronic component contain various types of electronic portions, such as a housing for a light source (e.g., light emitting diode ("LED")) for a light, such as a tunnel light headlamp, etc.), or other electronic equipment, such as used in computers, phones, electronic control units, etc. Such products may be particularly useful in vehicles (e.g., automobiles, buses, motorcycles, boats, etc.), such as an electric vehicle (EV), a hybrid electric vehicle (HEV), a plug-in hybrid electric vehicle (PHEV), or other type of vehicle using electric power for propulsion (collectively referred to as "electric vehicles").

Figure 6:
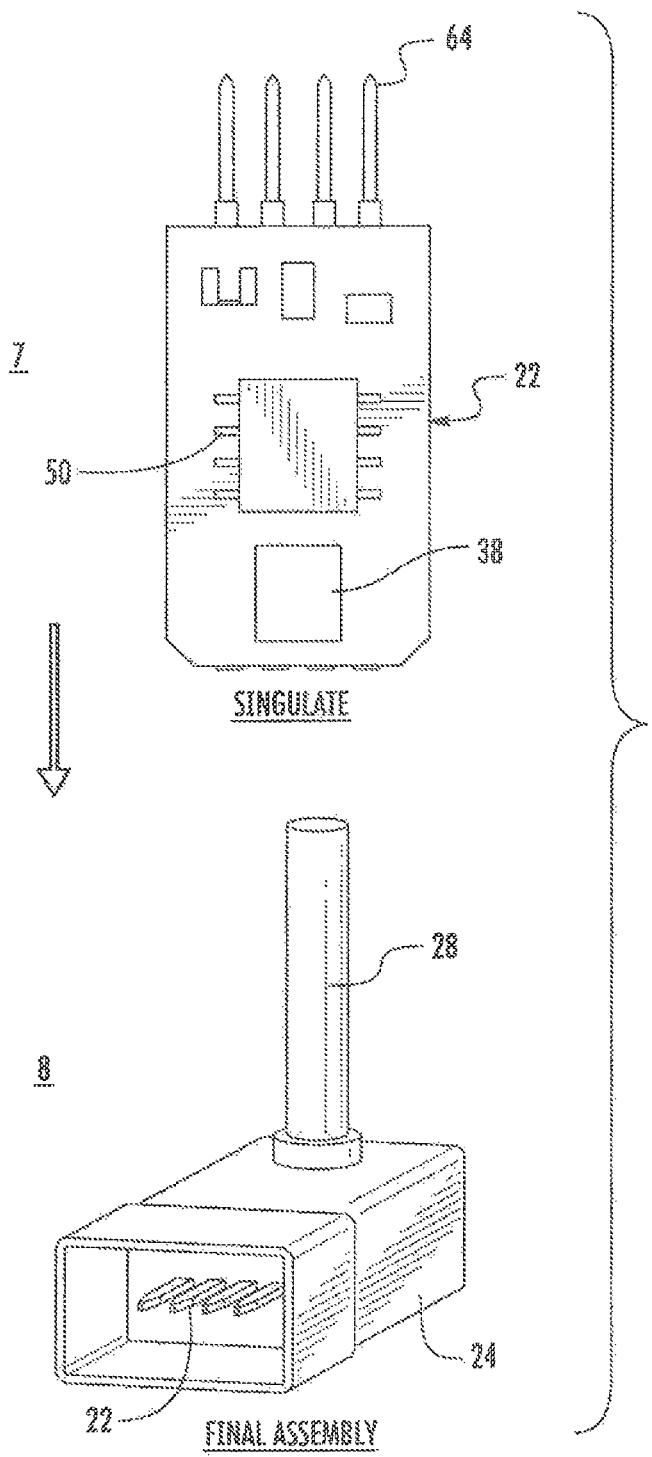
FIG. 6 is a flow diagram that shows additional steps that can be employed in the manufacturing process of FIG. 1.
Figure 7:
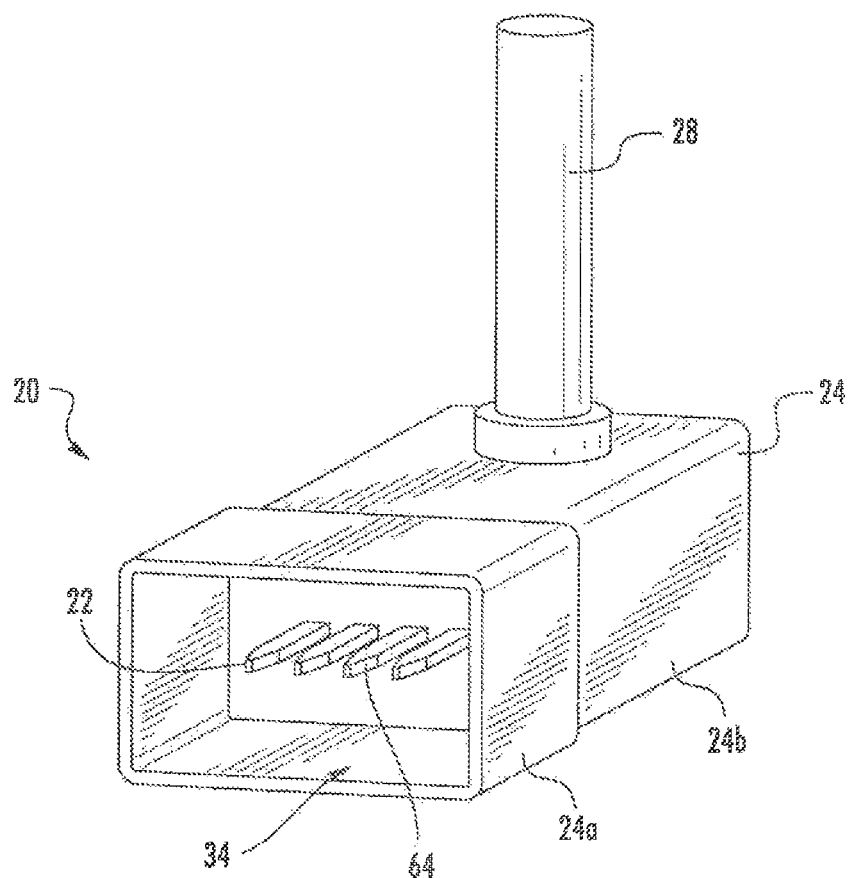
FIG. 7 is a perspective view of one embodiment of an electronic device in the form of an automotive light.
Figure 8:
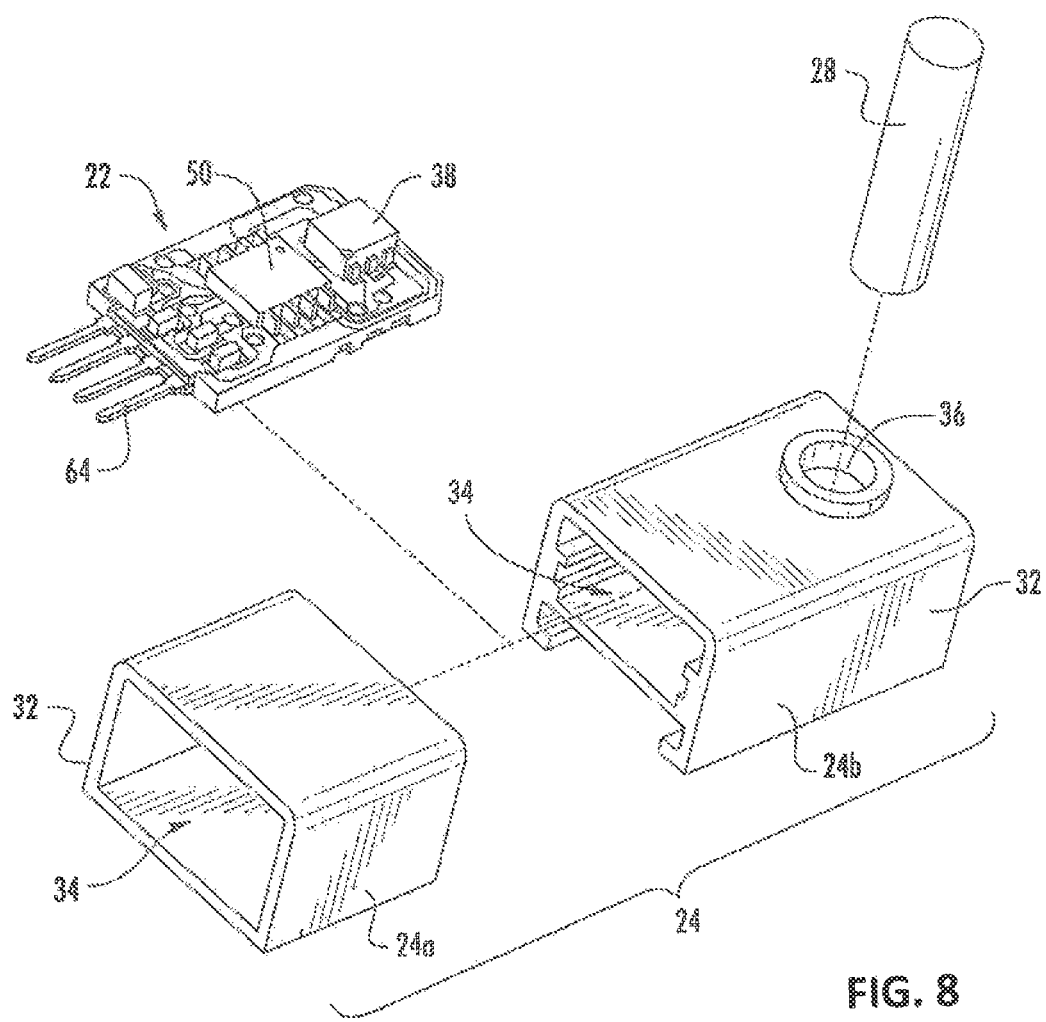
FIG. 8 is an exploded perspective view of the electronic device shown in FIG. 7.

Referring to FIGS. 7-8, for example, one embodiment an electronic component is shown that is in the form of a light 20 for use in automotive products. The light 20 includes a housing 24, an electronic device 22 (see also FIG. 2), and a light pipe 28. The housing 24 may be formed in two parts 24a and 24b as shown in FIG. 8. The housing 24 has a wall 32 forming a passageway 34 therethrough and an aperture 36 that extends through the wall 32 and is in communication with the passageway 34. The aperture 36 may be transverse to the passageway 34. The electronic component 22 may be mounted within the passageway 34 of the housing 24. The light pipe 28 extends through the aperture 36 in the housing 24 and is mounted above a light emitting diode (LED) 38, which is formed as one or more of the portions 50 of the electronic component 22 as described herein. FIG. 6 provides a representative process for forming the light 20. Steps 7 and 8, for instance, show that the electronic component 22 is singulated from the other devices and assembled with the housing 24 and light pipe 28. After the component 22 is formed, it is mounted within the passageway 34 and the parts 24a and 24b of the housing 24 are assembled together. The pin contacts 64 remain exposed. The light pipe 28 is mounted through the aperture 36 in the housing 24 and is provided above the LED(s) 38.

The electronic component may also be employed in a variety of other types of devices, such as desktop computers, portable computers, handheld electronic devices, automotive equipment, etc. In one suitable configuration, the electronic component is formed in the housing of a relatively compact portable electronic component in which the available interior space is relatively small. Examples of suitable portable electronic components include cellular telephones, laptop computers, small portable computers (e.g., ultraportable computers, netbook computers, and tablet computers), wrist-watch devices, pendant devices, headphone and earpiece devices, media players with wireless communications capabilities, handheld computers (also sometimes called personal digital assistants), remote controllers, global positioning system (GPS) devices, handheld gaming devices, etc. The electronic component could also be integrated with other components such as camera module, speaker or battery cover of a handheld device.

The present invention may be better understood with reference to the following example.

Test Methods

Melt Viscosity: The melt viscosity (Pa-s) may be determined in accordance with ISO Test No. 11443:2021 at a shear rate of 1,000 s$^{-1}$ and temperature 15° C. above the melting temperature using a Dynisco LCR7001 capillary rheometer. The rheometer orifice (die) had a diameter of 1 mm, length of 20 mm, L/D ratio of 20.1, and an entrance angle of 180°. The diameter of the barrel was 9.55 mm+0.005 mm and the length of the rod was 233.4 mm.

Melting Temperature: The melting temperature ("Tm") may be determined by differential scanning calorimetry ("DSC") as is known in the art. The melting temperature is the differential scanning calorimetry (DSC) peak melt temperature as determined by ISO Test No. 11357-2:2020. Under the DSC procedure, samples were heated and cooled at 20° C. per minute as stated in ISO Standard 10350 using DSC measurements conducted on a TA Q2000 Instrument.

Deflection Temperature Under Load ("DTUL"): The deflection under load temperature may be determined in accordance with ISO Test No. 75-2:2013 (technically equivalent to ASTM D648). More particularly, a test strip sample having a length of 80 mm, thickness of 10 mm, and width of 4 mm may be subjected to an edgewise three-point bending test in which the specified load (maximum outer fibers stress) was 1.8 Megapascals. The specimen may be lowered into a silicone oil bath where the temperature is raised at 2° C. per minute until it deflects 0.25 mm (0.32 mm for ISO Test No. 75-2:2013).

Tensile Modulus, Tensile Stress, and Tensile Elongation: Tensile properties may be tested according to ISO Test No. 527:2019 (technically equivalent to ASTM D638). Modulus and strength measurements may be made on the same test strip sample having a length of 80 mm, thickness of 10 mm, and width of 4 mm. The testing temperature may be 23° C., and the testing speeds may be 1 or 5 mm/min.

Flexural Modulus, Flexural Stress, and Flexural Elongation: Flexural properties may be tested according to ISO Test No. 178:2019 (technically equivalent to ASTM D790). This test may be performed on a 64 mm support span. Tests may be run on the center portions of uncut ISO 3167 multi-purpose bars. The testing temperature may be 23° C. and the testing speed may be 2 mm/min.

Unnotched and Notched Charpy Impact Strength: Charpy properties may be tested according to ISO Test No. ISO 179-1:2010) (technically equivalent to ASTM D256-10, Method B). This test may be run using a Type 1 specimen size (length of 80 mm, width of 10 mm, and thickness of 4 mm). When testing the notched impact strength, the notch may be a Type A notch (0.25 mm base radius). Specimens may be cut from the center of a multi-purpose bar using a single tooth milling machine. The testing temperature may be 23° C.

Dielectric Constant ("Dk") and Dissipation Factor ("Df"): The dielectric constant (or relative static permittivity) and dissipation factor are determined using a known split-post dielectric resonator technique, such as described in Baker-Jarvis, et al., IEEE Trans. on Dielectric and Electrical Insulation, 5(4), p. 571 (1998) and Krupka, et al., Proc. 7th International Conference on Dielectric Materials: Measurements and Applications, IEEE Conference Publication No. 430 (September 1996). More particularly, a plaque sample having a size of 80 mm×90 mm×3 mm was inserted between two fixed dielectric resonators. The resonator measured the permittivity component in the plane of the specimen. Five (5) samples are tested and the average value is recorded. The split-post resonator can be used to make dielectric measurements in the low gigahertz region, such as 1 GHz to 2 GHz. For testing of these properties after heat cycling, specimens may be placed in a temperature control chamber and heated/cooled within a temperature range of from −30° C. and 100° C. Initially, the samples are heated until reaching a temperature of 100° C., when they were immediately cooled. When the temperature reaches −30° C., the specimens are immediately heated again until reaching 100° C. Twenty three (23) heating/cooling cycles may be performed over a 3-hour time period.

Surface/Volume Resistivity: The surface and volume resistivity values are generally determined in accordance with IEC 62631-3-1:2016 or ASTM D257-14. According to this procedure, a standard specimen (e.g., 1 meter cube) is placed between two electrodes. A voltage is applied for sixty (60) seconds and the resistance is measured. The surface resistivity is the quotient of the potential gradient (in V/m) and the current per unit of electrode length (in A/m), and generally represents the resistance to leakage current along the surface of an insulating material. Because the four (4) ends of the electrodes define a square, the lengths in the quotient cancel and surface resistivities are reported in ohms, although it is also common to see the more descriptive unit of ohms per square. Volume resistivity is also determined as the ratio of the potential gradient parallel to the current in a material to the current density. In SI units, volume resistivity is numerically equal to the direct-current resistance between opposite faces of a one-meter cube of the material (ohm-m).

Example

A sample is formed for use in the substrate of a molded interconnect device as described herein. The sample contains a liquid crystalline polymer ("LCP 1"), Nyglos™ 8 (wollastonite fibers having a median diameter of 12 μm, aspect ratio of 13:1, and median length of 156 μm), carbon black pigment, and Glycolube™ P. LCP 1 is formed from 60 mol. % HBA, 5 mol. % HNA, 12 mol. % BP, 17.5 mol. % TA, and 5 mol. % APAP. Compounding is performed using an 18-mm single screw extruder. The sample is injection molded into a plaque (60 mm×60 mm).

TABLE 1

| Sample | Wt. % | Parts |
| --- | --- | --- |
| LCP 1 | 67.2 | 100 |
| Wollastonite Fibers | 30 | 44.6 |
| Carbon Black Pigment | 2.5 | 3.7 |
| Lubricant | 0.3 | 0.4 |

The resulting sample is tested for thermal and mechanical properties. The results are set forth below in Table 2.

TABLE 2

| | Property of Sample |
| --- | --- |
| In-Plane Thermal Conductivity (W/m-K) | 2.5 |
| Through-Plane Thermal Conductivity (W/m-K) | 0.6 |
| Surface Resistivity (ohm) | $1.9 \times 10^{17}$ |
| Volume Resistivity (ohm-m) | $3.7 \times 10^{14}$ |
| Notched Charpy (kJ/m$^2$) | 10 |
| Unnotched Charpy (kJ/m$^2$) | 29 |
| Tensile Strength (MPa) | 143 |
| Tensile Modulus (MPa) | 14,000 |
| Tensile Elongation (%) | 2.7 |
| Flexural Strength (MPa) | 160 |
| Flexural Modulus (MPa) | 13,000 |
| Melting Temperature (° C., 1$^{st}$ heat of DSC) | 330 |
| DTUL (1.8 MPa, ° C.) | 240 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A molded interconnect device comprising:
   a substrate comprising a polymer composition containing a polymer matrix that includes a thermotropic liquid crystalline polymer and from about 10 parts to about 80 parts by weight of a mineral filler per 100 parts by weight of the polymer matrix, wherein the mineral filler has an average diameter of about 25 micrometers or less, wherein the polymer composition contains copper in an amount of about 1,000 parts per million or less and chromium in an amount of about 2,000 parts per million or less, and further wherein the polymer composition exhibits a surface resistivity of about $1 \times 10^{16}$ ohm or more as determined in accordance with IEC 62631-3-1:2016; and
   conductive elements disposed on the substrate.

2. The molded interconnect device of claim 1, wherein the polymer composition is free of spinel crystals having the formula, $AB_2O_4$, wherein A is a metal cation having a valance of 2 and B is a metal cation having a valance of 3.

3. The molded interconnect device of claim 1, wherein the polymer composition is free of copper chromite.

4. The molded interconnect device of claim 1, wherein the polymer composition exhibits a volume resistivity of about $1 \times 10^{12}$ ohm-m or more as determined in accordance with IEC 62631-3-1:2016.

5. The molded interconnect device of claim 1, wherein the polymer composition exhibits a surface resistivity of about $1 \times 10^{17}$ ohm or more as determined in accordance with IEC 62631-3-1:2016.

6. The molded interconnect device of claim 1, wherein the polymer composition is free of electrically conductive fillers having an intrinsic volume resistivity of less than about 0.1 ohm-cm.

7. The molded interconnect device of claim 1, wherein the polymer composition is free of electrically conductive carbon materials.

8. The molded interconnect device of claim 1, wherein the polymer matrix constitutes from about 30 wt. % to about 80 wt. % of the polymer composition.

9. The molded interconnect device of claim 1, wherein the liquid crystalline polymer has a melting temperature of about 280° C. or more.

10. The molded interconnect device of claim 1, wherein the liquid crystalline polymer contains one or more repeating units derived from an aromatic hydroxycarboxylic acid, wherein the hydroxycarboxylic acid repeating units constitute about 40 mol. % or more of the polymer.

11. The molded interconnect device of claim 10, wherein the liquid crystalline polymer contains repeating units derived from 4-hydroxybenzoic acid, 6-hydroxy-2-naphthoic acid, or a combination thereof.

12. The molded interconnect device of claim 11, wherein the liquid crystalline polymer contains repeating units derived from 4-hydroxybenzoic acid in an amount of from about 30 mol. % to about 90 mol. % of the polymer and contains repeating units derived from 6-hydroxy-2-naphthoic acid in amount of from about 1 mol. % to about 30 mol. % of the polymer.

13. The molded interconnect device of claim 10, wherein the liquid crystalline polymer further contains repeating units derived from terephthalic acid, isophthalic acid, 2,6-naphthalenedicarboxylic acid, hydroquinone, 4,4'-biphenol, acetaminophen, 4-aminophenol, or a combination thereof.

14. The molded interconnect device of claim 1, wherein the polymer composition exhibits an in-plane thermal conductivity of about 1 W/m-K or more as determined in accordance with ASTM E1461-13 and/or a through-plane thermal conductivity of about 0.2 W/m-K or more as determined in accordance with ASTM E1461-13.

15. The molded interconnect device of claim 1, wherein the mineral filler contains mineral particles.

16. The molded interconnect device of claim 15, wherein the mineral particles include talc, mica, silica, or a combination thereof.

17. The molded interconnect device of claim 1, wherein the mineral filler contains mineral fibers.

18. The molded interconnect device of claim 17, wherein the mineral fibers include wollastonite.

19. The molded interconnect device of claim 17, wherein the mineral fibers have a median length of from about 40 to about 220 micrometers.

20. The molded interconnect device of claim 17, wherein the mineral fibers have an aspect ratio of from about 2 to about 50.

21. The molded interconnect device of claim 1, wherein the polymer composition has a melt viscosity of from about 10 to about 250 Pa-s, as determined in accordance with ISO Test No. 11443:2014 at a shear rate of 1,000 $s^{-1}$ and temperature that is 15° C. above the melting temperature of the composition.

22. The molded interconnect device of claim 1, wherein the conductive elements comprise a metal.

23. The molded interconnect device of claim 1, wherein channels are formed in the substrate in the form of an interconnect pattern, and wherein the conductive elements are disposed within the channels.

24. The molded interconnect device of claim 23, wherein the conductive elements include a first metal layer and a second metal layer.

* * * * *